US012704555B2

(12) United States Patent
Cha et al.

(10) Patent No.: US 12,704,555 B2
(45) Date of Patent: Aug. 11, 2026

(54) BATTERY CLASSIFICATION APPARATUS AND METHOD

(71) Applicant: LG Energy Solution, Ltd., Seoul (KR)

(72) Inventors: A-Ming Cha, Daejeon (KR); Yoon-Jung Bae, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 457 days.

(21) Appl. No.: 18/031,666

(22) PCT Filed: Mar. 21, 2022

(86) PCT No.: PCT/KR2022/003930
§ 371 (c)(1),
(2) Date: Apr. 13, 2023

(87) PCT Pub. No.: WO2022/203322
PCT Pub. Date: Sep. 29, 2022

(65) Prior Publication Data

US 2023/0393214 A1 Dec. 7, 2023

(30) Foreign Application Priority Data

Mar. 24, 2021 (KR) ........................ 10-2021-0038129

(51) Int. Cl.
*G01R 31/389* (2019.01)
*G01R 31/367* (2019.01)
*G01R 31/378* (2019.01)
*H01M 10/42* (2006.01)
*H01M 10/48* (2006.01)

(52) U.S. Cl.
CPC ......... *G01R 31/389* (2019.01); *G01R 31/367* (2019.01); *G01R 31/378* (2019.01);
(Continued)

(58) Field of Classification Search
None
See application file for complete search history.

(56) References Cited

U.S. PATENT DOCUMENTS 5,438,248 A 8/1995 Hyuck
5,485,090 A * 1/1996 Stephens ............ H02J 7/00038 320/106

(Continued)

FOREIGN PATENT DOCUMENTS

EP 0611106 A1 8/1994
JP S60194377 A 10/1985

(Continued)

OTHER PUBLICATIONS

International Search Report for PCT/KR2022/003930 mailed Jul. 21, 2022. 3 pgs.

(Continued)

*Primary Examiner* — Raymond L Nimox
(74) *Attorney, Agent, or Firm* — Lerner David LLP

(57) ABSTRACT

A battery classification apparatus includes: a measuring unit configured to measure a voltage of a battery and measure a resistance corresponding to the voltage of the battery; a profile generating unit configured to obtain battery information about the voltage and the resistance of the battery measured by the measuring unit and generate a resistance profile representing a corresponding relationship between the voltage and the resistance based on the battery information; and a control unit configured to determine a criterion resistance based on a resistance value in the resistance profile, determine a reference resistance corresponding to a highest voltage in the resistance profile, and classify a type of the battery based on the criterion resistance and the reference resistance according to a content of nickel contained in the battery.

13 Claims, 5 Drawing Sheets

(52) U.S. Cl.
CPC ..... *H01M 10/4221* (2013.01); *H01M 10/425* (2013.01); *H01M 10/4285* (2013.01); *H01M 10/48* (2013.01)

(56) References Cited

U.S. PATENT DOCUMENTS

| | | | | |
|---|---|---|---|---|
| 2007/0072059 | A1 | 3/2007 | Kitao et al. | |
| 2011/0234232 | A1 | 9/2011 | Ro | |
| 2019/0178946 | A1 | 6/2019 | Han et al. | |
| 2020/0088805 | A1 | 3/2020 | Cha | |
| 2022/0085427 | A1* | 3/2022 | Tajima | H02J 7/007192 |

FOREIGN PATENT DOCUMENTS

| | | | |
|---|---|---|---|
| JP | H06249931 | A | 9/1994 |
| JP | 2609038 | B2 | 5/1997 |
| JP | 2002042895 | A | 2/2002 |
| JP | 2007095354 | A | 4/2007 |
| JP | 4457781 | B2 | 4/2010 |
| JP | 2013187960 | A | 9/2013 |
| JP | 2017111860 | A | 6/2017 |
| JP | 201996561 | A | 6/2019 |
| JP | 6615964 | B2 | 12/2019 |
| KR | 20040107752 | A | 12/2004 |
| KR | 20110107070 | A | 9/2011 |
| KR | 20140107752 | A | 9/2014 |
| KR | 101819255 | B1 | 2/2018 |
| KR | 20190083217 | A | 7/2019 |
| KR | 20200102923 | A | 9/2020 |

OTHER PUBLICATIONS

Extended European Search Report including Written Opinion for Application No. 22776023.8 dated Nov. 24, 2023, pp. 1-8.

* cited by examiner

BATTERY CLASSIFICATION APPARATUS AND METHOD

CROSS REFERENCE TO RELATED APPLICATIONS

The present application is a national phase entry under 35 U.S.C. § 371 of International Application No. PCT/KR2022/003930 filed Mar. 21, 2022 which claims priority to Korean Patent Application No. 10-2021-0038129 filed on Mar. 24, 2021 in the Republic of Korea, the disclosures of which are incorporated herein by reference.

TECHNICAL FIELD

The present disclosure relates to a battery classification apparatus and method, and more particularly, to a battery classification apparatus and method capable of classifying a type of a battery in a non-destructive manner.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

These batteries may be classified into high nickel-based batteries or low nickel-based batteries according to the nickel content in the positive electrode material. In general, the high nickel-based batteries and the low nickel-based batteries are classified based on the nickel content contained in the positive electrode material. For example, if the nickel content is equal to or greater than 80%, the battery is classified as a high nickel-based battery, and if the nickel content is less than 80%, the battery is classified as a low nickel-based battery.

Conventionally, when an unknown battery of which the composition of the positive electrode material is unknown is collected, in order to classify the type of the unknown battery, the composition of the positive electrode material of the unknown battery is directly confirmed through an experiment after disassembling the battery. In this case, there is a problem that considerable cost and time are consumed in the process of disassembling and reassembling the battery, and accidents such as battery explosion may occur depending on the technical skill of the technician.

Therefore, it is required to develop a technology that may classify the type of battery according to the composition of the positive electrode material of the battery in a non-destructive manner.

SUMMARY

Technical Problem

The present disclosure is designed to solve the problems of the related art, and therefore the present disclosure is directed to providing a battery classification apparatus and method capable of classifying a type of a battery in a non-destructive way based on battery information about voltage and resistance of the battery.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery classification apparatus according to one aspect of the present disclosure may comprise a processor and memory having programmed thereon instructions that, when executed, are configured to cause the processor to: measure a voltage of a battery and measure a resistance corresponding to the voltage of the battery; obtain battery information about the measured voltage and the measured resistance of the battery; generate a resistance profile representing a corresponding relationship between the voltage and the resistance based on the battery information; determine a criterion resistance based on a resistance value in the resistance profile; determine a reference resistance corresponding to a highest voltage in the resistance profile, and classify a type of the battery based on the criterion resistance and the reference resistance according to a content of nickel contained in the battery.

The instructions may be configured to cause the processor to determine a lowest resistance value in the resistance profile as the criterion resistance.

The instructions may be configured to cause the processor to set a threshold resistance based on the criterion resistance, compare the set threshold resistance with the reference resistance, and classify the type of the battery according to the comparison result.

The type of the battery may be classified into a high nickel-based battery or a low nickel-based battery according to the content of nickel contained in the battery.

The instructions may be configured to cause the processor to classify the battery into a high nickel-based battery, when the reference resistance is equal to or greater than the threshold resistance.

The instructions may be configured to cause the processor to classify the battery into a low nickel-based battery, when the reference resistance is less than the threshold resistance.

The instructions may be configured to cause the processor to set the threshold resistance by applying a preset criterion ratio to the criterion resistance.

The instructions may be configured to cause the processor to determine a target voltage in a target voltage region between a voltage corresponding to the criterion resistance and a voltage corresponding to the reference resistance, and set the determined target voltage as a charging upper limit voltage for the battery.

The instructions may be configured to cause the processor to set the charging upper limit voltage for the battery, when the battery is classified as the high nickel-based battery.

The instructions may be configured to cause the processor to calculate a resistance change rate of the resistance for each voltage in the target voltage region and set a lowest voltage among voltages at which the calculated resistance change rate is equal to or greater than a preset criterion value as the charging upper limit voltage.

The instructions may be configured to cause the processor to determine a resistance flat region based on the criterion resistance in the target voltage region and set an end voltage of the determined resistance flat region as the charging upper limit voltage.

The instructions may be configured to cause the processor to determine a voltage region corresponding to a resistance region equal to or less than a preset threshold value from the criterion resistance in the target voltage region and determine the determined voltage region as the resistance flat region.

The instructions may be configured to cause the processor to calculate a capacity of the battery in the process of charging the battery and measure the voltage and the resistance whenever the calculated capacity of the battery increases by a predetermined ratio.

A battery pack according to another aspect of the present disclosure may comprise the battery classification apparatus according to an aspect of the present disclosure.

A battery classification method according to still another aspect of the present disclosure may comprise: measuring by a controller a voltage of a battery and measuring a resistance corresponding to the voltage of the battery; obtaining by the controller a resistance profile representing a corresponding relationship between the voltage and the resistance based on the voltage and the resistance of the battery; determining by the controller a criterion resistance based on a resistance value in the resistance profile and determining a reference resistance corresponding to a highest voltage in the resistance profile; and classifying by the controller a type of the battery based on the criterion resistance and the reference resistance according to a content of nickel contained in the battery.

A battery classification method according to still another aspect of the present disclosure may further comprise, upon classifying the battery, determining by the controller a target voltage in a target voltage region between a voltage corresponding to the criterion resistance and a voltage corresponding to the reference resistance and setting the determined target voltage as a charging upper limit voltage for the battery.

Advantageous Effects

According to one aspect of the present disclosure, there is an advantage that the type of battery can be specifically classified in a non-destructive manner, based on the corresponding relationship between voltage and resistance for the battery.

The effects of the present disclosure are not limited to the effects mentioned above, and other effects not mentioned will be clearly understood by those skilled in the art from the description of the claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
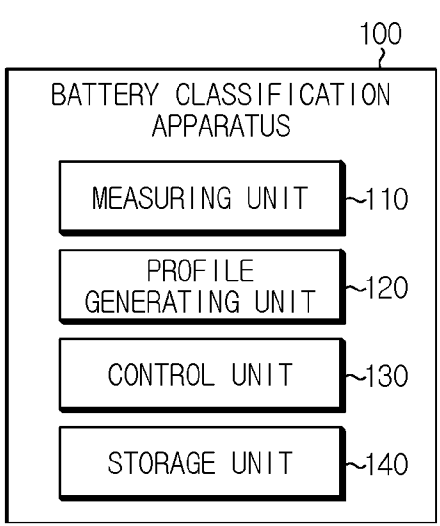
FIG. 1 is a diagram schematically showing a battery classification apparatus according to an embodiment of the present disclosure.

FIG. 1 is a diagram schematically showing a battery classification apparatus 100 according to an embodiment of the present disclosure.

Referring to FIG. 1, the battery classification apparatus 100 may include a measuring unit 110, a profile generating unit 120, and a control unit 130.

The measuring unit 110 may be configured to measure a voltage of a battery and measure a resistance corresponding to the voltage of the battery.

Here, the battery means one physically separable independent cell including a negative electrode terminal and a positive electrode terminal. For example, one lithium-ion battery or lithium polymer battery may be regarded as a battery. In addition, the battery may refer to a battery module in which a plurality of cells are connected in series and/or in parallel. Hereinafter, for convenience of description, the battery will be described as meaning one independent cell.

Specifically, the measuring unit 110 may measure an open circuit voltage (OCV) of the battery. In addition, after measuring the OCV of the battery, the measuring unit 110 may output a pulse signal to the battery and measure the resistance of the battery based on a voltage change for a predetermined time.

For example, the measuring unit 110 may output a 0.5 C (C-rate) pulse signal to the battery, and measure the resistance of the battery based on the change in voltage of the battery for 0.1 seconds. In this case, the resistance measured by the measuring unit 110 may be defined as "0.1 second resistance".

More specifically, the measuring unit 110 may be configured to calculate a capacity of the battery by accumulating the charging current in the process of charging the battery. In addition, the measuring unit 110 may be configured to measure the voltage and resistance whenever the calculated capacity of the battery increases by a predetermined ratio.

For example, the measuring unit 110 may measure the voltage and resistance of the battery whenever the capacity of the battery increases by 2%.

The profile generating unit 120 may be configured to obtain battery information about the voltage and resistance of the battery measured by the measuring unit 110.

For example, the profile generating unit 120 and the measuring unit 110 may be connected to communicate with each other. The measuring unit 110 may output the battery information for the measured voltage and resistance of the battery to the profile generating unit 120, and the profile generating unit 120 may receive the battery information from the measuring unit 110.

The profile generating unit 120 may be configured to generate a resistance profile representing a corresponding relationship between the voltage and the resistance based on the battery information.

Specifically, the resistance profile may be a profile representing a corresponding relationship between the voltage and the resistance measured by the measuring unit 110 whenever the capacity of the battery increases by a predetermined ratio. For example, the resistance profile may be expressed as an X-Y graph when X is set as voltage and Y is set as resistance.

Figure 2:
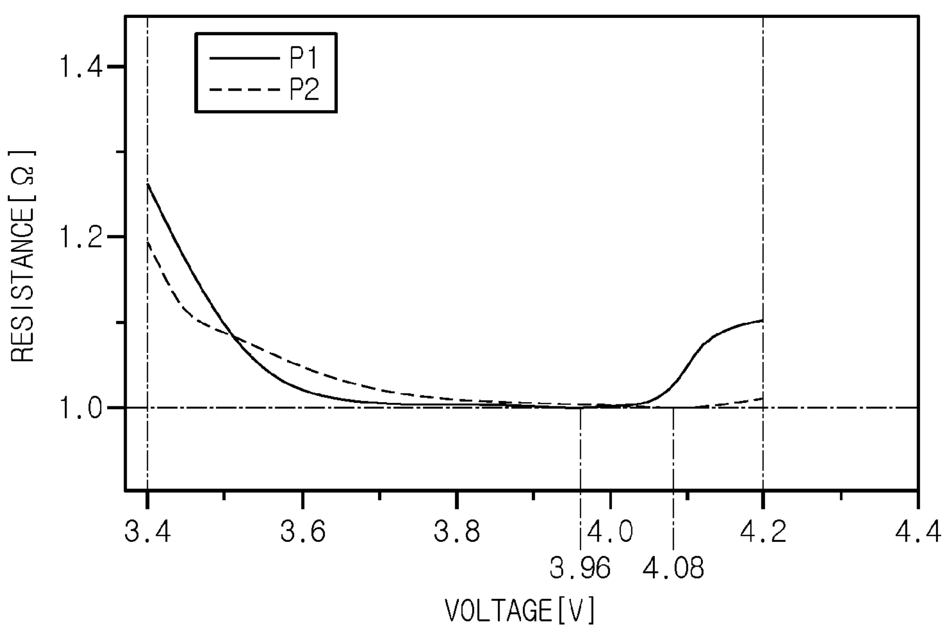
FIG. 2 is a diagram schematically showing a first resistance profile and a second resistance profile according to an embodiment of the present disclosure.

FIG. 2 is a diagram schematically showing a first resistance profile P1 and a second resistance profile P2 according to an embodiment of the present disclosure.

In the embodiment of FIG. 2, the first resistance profile P1 is a resistance profile for a first battery, and is a profile representing a corresponding relationship between the voltage and resistance for a voltage range of 3.4 V or more and 4.2 V or less. Specifically, the first resistance profile P1 is a profile representing the corresponding relationship between the voltage (specifically, the OCV) of the first battery and the resistance whenever the capacity of the first battery increases by 2%.

In addition, in the embodiment of FIG. 2, the second resistance profile P2 is a resistance profile for the second battery, and is a profile representing a corresponding relationship between the voltage and resistance for a voltage range of 3.4 V or more and 4.2 V or less. Specifically, the second resistance profile P2 is a profile representing the corresponding relationship between the voltage (specifically, the OCV) of the second battery and the resistance whenever the capacity of the second battery increases by 2%.

The control unit 130 and the profile generating unit 120 may be connected to be able to communicate with each other.

For example, the control unit 130 and the profile generating unit 120 may be connected to each other in a wireless and/or wired manner, and the control unit 130 may receive the resistance profile generated from the profile generating unit 120.

The control unit 130 may be configured to determine a criterion resistance based on the resistance value in the resistance profile.

Preferably, the control unit 130 may be configured to determine a lowest resistance value in the resistance profile as the criterion resistance.

For example, in the embodiment of FIG. 2, the lowest resistance value in the first resistance profile P1 may be 1Ω, and the voltage corresponding to the lowest resistance value may be 3.96 V. In addition, the lowest resistance value in the second resistance profile P2 may be 1Ω, and the voltage corresponding to the lowest resistance value may be 4.08 V. Accordingly, the control unit 130 may determine the criterion resistances ($R1_{STD}$, $R2_{STD}$) for the first resistance profile P1 and the second resistance profile P2 as 1Ω.

The control unit 130 may be configured to determine a reference resistance corresponding to the highest voltage in the resistance profile.

For example, the highest voltage in the resistance profile may be a charging end voltage at which charging for the battery ends. The control unit 130 may determine a resistance value corresponding to the charging end voltage of the battery as a reference resistance.

Figure 3:
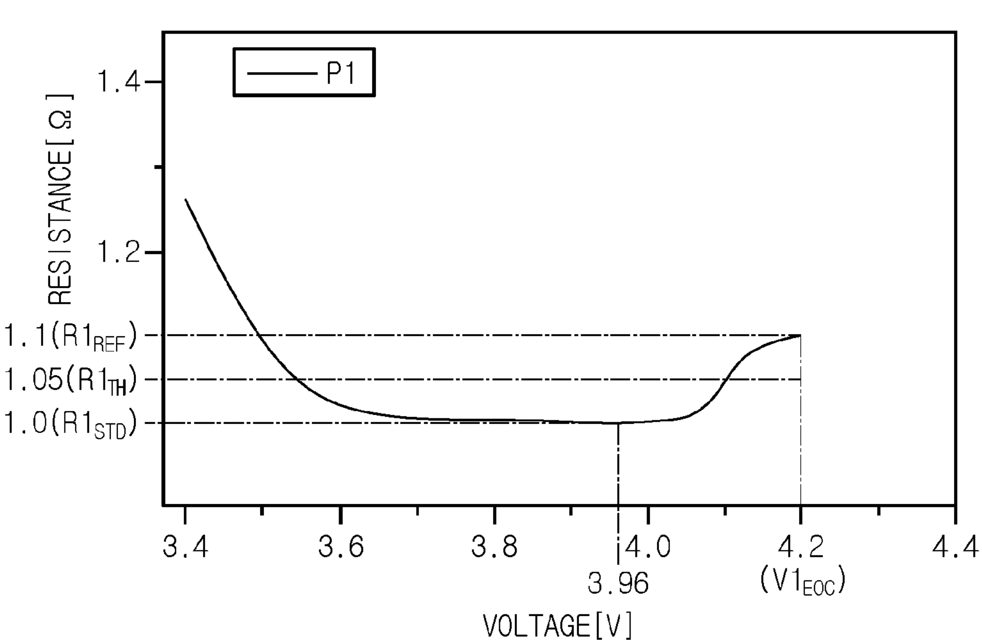
FIG. 3 is a diagram showing the first resistance profile of FIG. 2 more specifically.

FIG. 3 is a diagram showing the first resistance profile P1 of FIG. 2 more specifically.

For example, in the embodiment of FIG. 3, the first battery may be charged from 3.4 V to 4.2 V. The control unit 130 may determine 1Ω, which is the lowest resistance value of the first resistance profile P1, as the criterion resistance ($R1_{STD}$), and may determine 1.1Ω, which is a resistance value corresponding to 4.2 V that is the charging end voltage ($V1_{EOC}$), as the reference resistance ($R1_{REF}$).

The control unit 130 may be configured to classify the type of battery according to the content of nickel contained in the battery based on the criterion resistance and the reference resistance.

Here, the type of the battery may be classified according to the content of nickel contained in the positive electrode material of the battery. For example, if the nickel content contained in the positive electrode material of the battery is equal to or greater than 80%, the battery may be classified as a high nickel-based battery. Conversely, if the nickel content is less than 80%, the battery may be classified as a low nickel-based battery.

The battery classification apparatus 100 according to an embodiment of the present disclosure has an advantage of specifically classifying the type of the battery in a non-destructive manner based on the corresponding relationship between voltage and resistance for the battery.

In addition, since the battery classification apparatus 100 may specifically classify the type of the battery based on the voltage and resistance of the battery for one cycle (one full charge cycle), the degradation of the battery in the process of classifying the type of the battery may be minimized.

For example, when an unknown battery whose positive electrode material composition is unknown is collected, the battery classification apparatus 100 may classify the unknown battery into a high nickel-based battery or a low nickel-based battery in a non-destructive manner based on the voltage and resistance of the unknown battery.

Meanwhile, the control unit 130 provided in the battery classification apparatus 100 may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 130 may be implemented as a set of program modules. At this time, the program module may be stored in a memory and executed by the control unit 130. The memory may be located inside or out of the control unit 130 and may be connected to the control unit 130 by various well-known means.

In addition, the battery classification apparatus 100 may further include a storage unit 140. The storage unit 140 may store data necessary for operation and function of each component of the battery classification apparatus 100, data generated in the process of performing the operation or function, or the like. The storage unit 140 is not particularly limited in its kind as long as it is a known information storage means that can record, erase, update and read data. As an example, the information storage means may include random access memory (RAM), flash memory, read-only memory (ROM), electrically erasable programmable read-only memory (EEPROM), registers, and the like. In addition, the storage unit 140 may store program codes in which processes executable by the control unit 130 are defined.

For example, the storage unit 140 may be connected to the measuring unit 110, the profile generating unit 120 and the control unit 130. The storage unit 140 may store the battery information including the voltage and resistance measured by the measuring unit 110. In addition, the profile generating unit 120 may not only directly receive the battery information from the measuring unit 110, but may also access the storage unit 140 to obtain the battery information stored in the storage unit 140.

In addition, the storage unit 140 may store the resistance profile generated by the profile generating unit 120. In addition, the control unit 130 may not only directly receive the resistance profile from the profile generating unit 120, but may also access the storage unit 140 to obtain the resistance profile stored in the storage unit 140.

Hereinafter, an embodiment in which the battery classification apparatus 100 classifies the type of the battery will be described in detail.

The control unit 130 may be configured to set a threshold resistance based on the criterion resistance.

Specifically, the control unit 130 may be configured to set the threshold resistance by applying a preset criterion ratio to the criterion resistance.

Here, the criterion ratio may be a ratio set in consideration of the positive electrode characteristics of the high nickel-based battery and the low nickel-based battery. For example, in a high nickel-based battery, the resistance at the charging end may be significantly increased than the criterion resistance, depending on the positive electrode characteristics with a high nickel content. On the other hand, in a low nickel-based battery, the resistance at the charging end may not differ significantly from the criterion resistance, depending on the positive electrode characteristics with a low nickel content. That is, the criterion ratio may be a ratio set in consideration of the positive electrode characteristics of the high nickel-based battery and the positive electrode characteristics of the low nickel-based battery, which appear as resistance at the charging end. For example, the criterion ratio may be preset to 5%.

For example, in the embodiment of FIG. 3, it is assumed that the criterion ratio is preset to 5%. The control unit 130 may determine the criterion resistance ($R1_{STD}$) as 1Ω in the first resistance profile P1. The control unit 130 may set a resistance value 1.05Ω, which is obtained by applying the criterion ratio of 5% to the criterion resistance ($R1_{STD}$) of 1Ω, as the threshold resistance.

The control unit 130 may be configured to compare the threshold resistance with the reference resistance.

Specifically, the control unit 130 may compare absolute values of the threshold resistance and the reference resistance.

The control unit 130 may be configured to classify the type of the battery according to the comparison result.

For example, the control unit 130 may be configured to classify the battery as a high nickel-based battery, when the reference resistance is equal to or greater than the threshold resistance. Conversely, the control unit 130 may be configured to classify the battery as a low nickel-based battery, when the reference resistance is less than the threshold resistance.

In the embodiment of FIG. 3, the threshold resistance ($R1_{TH}$) of the first resistance profile P1 may be 1.05Ω, and the reference resistance ($R1_{REF}$) may be 1.1Ω. Since the reference resistance ($R1_{REF}$) is greater than or equal to the threshold resistance ($R1_{TH}$), the control unit 130 may classify the first battery as a high nickel-based battery. That is, the control unit 130 may classify the first battery as a battery in which the nickel content contained in the positive electrode material is 80% or more.

Figure 4:
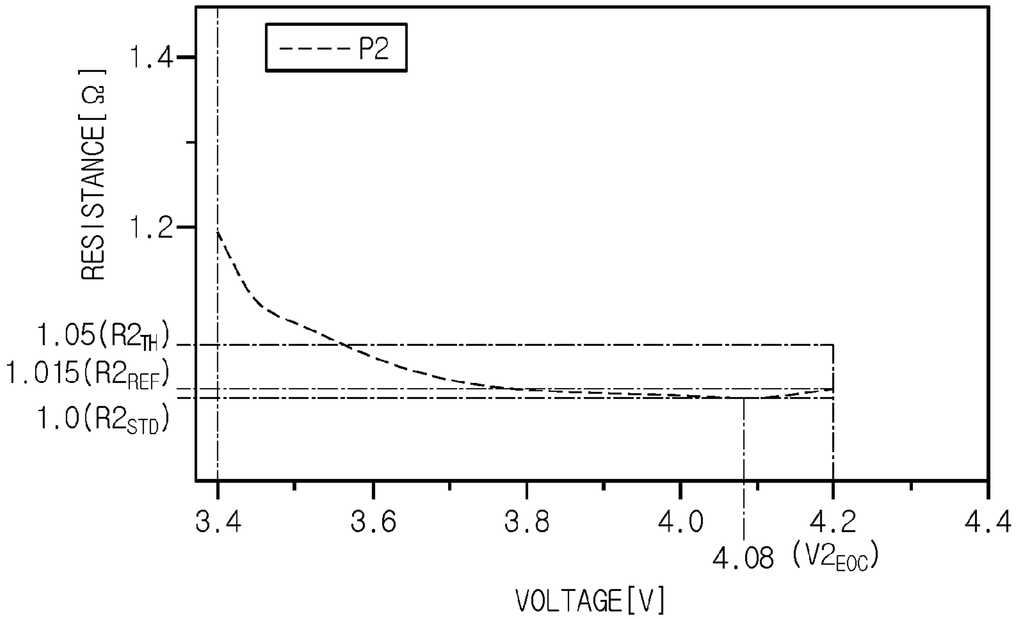
FIG. 4 is a diagram showing the second resistance profile of FIG. 2 more specifically.

FIG. 4 is a diagram showing the second resistance profile P2 of FIG. 2 more specifically.

In the embodiment of FIG. 4, the lowest resistance value in the second resistance profile P2 may be 1Ω, and the voltage corresponding to the lowest resistance value may be 4.08 V. Accordingly, the control unit 130 may determine the criterion resistance ($R2_{STD}$) for the second resistance profile P2 as 1Ω.

In addition, the second battery may be charged from 3.4 V to 4.2 V. The control unit 130 may determine the resistance value of 1.015Ω corresponding to 4.2 V, which is the charging end voltage ($V2_{EOC}$) of the second battery, as the reference resistance ($R2_{REF}$).

In the embodiment of FIG. 4, it is assumed that the criterion ratio is preset to 5%. The control unit 130 may set the resistance value of 1.05Ω, which is obtained by applying the criterion ratio of 5% to 1Ω that is the criterion resistance ($R2_{STD}$) of the second resistance profile P2, as the threshold resistance ($R2_{TH}$).

In addition, since the reference resistance ($R2_{REF}$) is less than the threshold resistance ($R2_{TH}$), the control unit 130 may classify the second battery as a low nickel-based battery. That is, the control unit 130 may classify the second battery as a battery in which the nickel content contained in the positive electrode material is less than 80%.

Hereinafter, an embodiment in which the battery classification apparatus 100 classifies the type of a battery and then sets a charging upper limit voltage for each battery will be described in detail.

Figure 5:
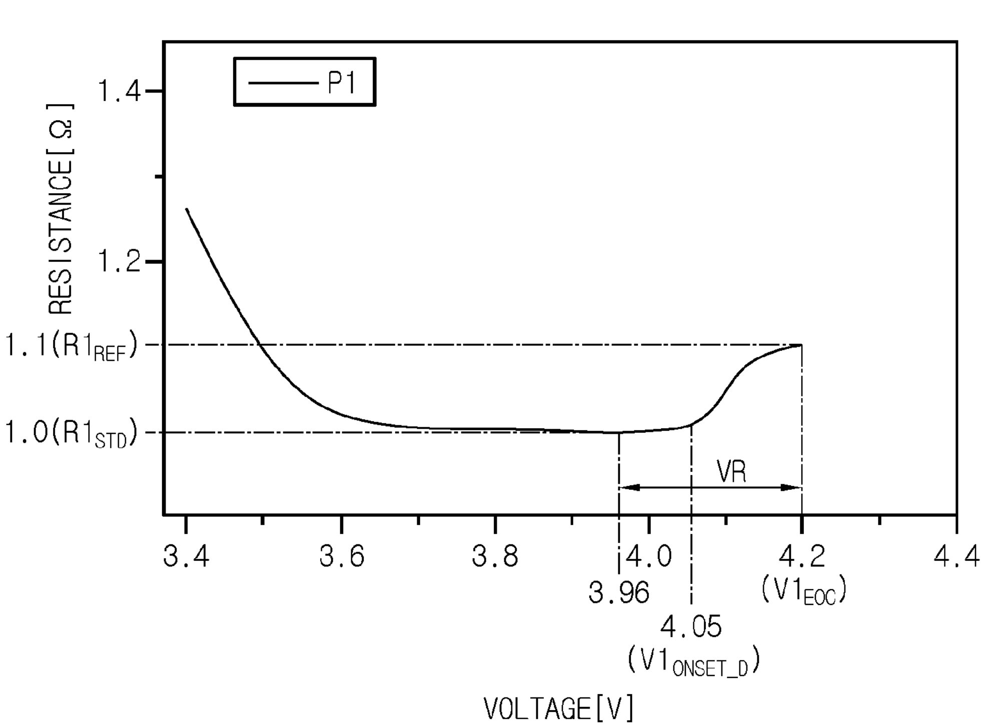
FIGS. 5 and 6 are diagrams showing an embodiment in which a charging upper limit voltage of the battery is set based on the first resistance profile of FIG. 2.
Figure 6:
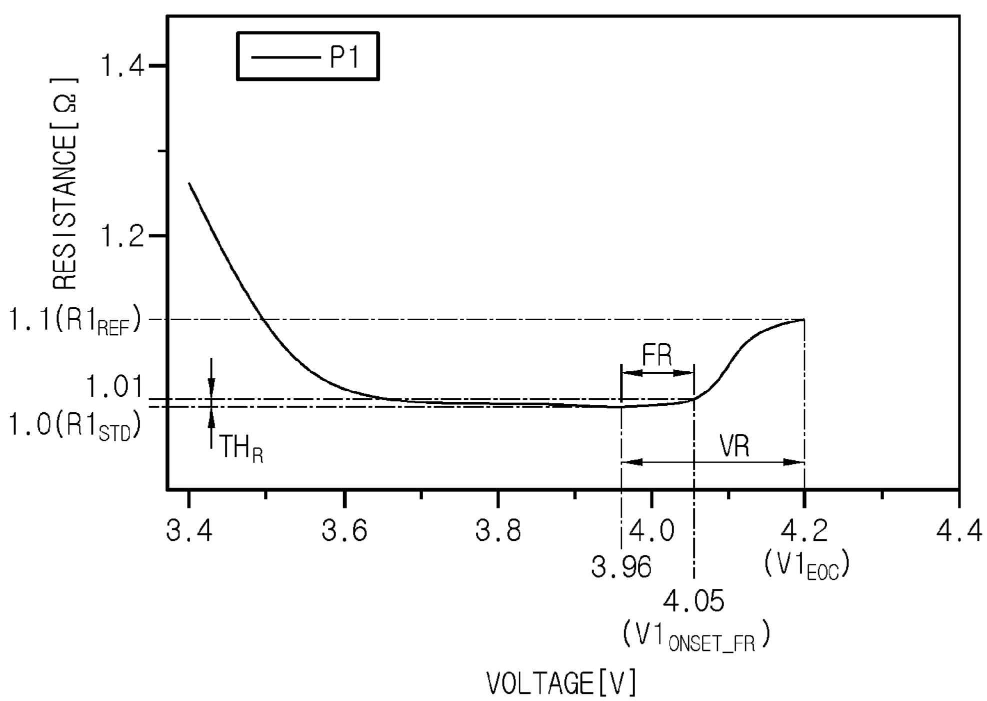

FIGS. 5 and 6 are diagrams showing an embodiment in which a charging upper limit voltage of the battery is set based on the first resistance profile P1 of FIG. 2.

Preferably, the control unit 130 may be configured to set a charging upper limit voltage for the battery when the battery is classified as a high nickel-based battery.

For example, referring to FIG. 2, even when the first battery and the second battery are charged in the same voltage region (3.4 V to 4.2 V), the resistance of the first battery, which is a high nickel-based battery, may be further increased than the second battery, which is a low nickel-based battery, at the charging end. Accordingly, the control unit 130 may prevent the degradation of the battery from being accelerated at the charging end depending on the positive electrode characteristics by setting the charging upper limit voltage of the battery classified as a high nickel-based battery.

Specifically, the control unit 130 may be configured to determine a target voltage in a target voltage region VR between a voltage corresponding to the criterion resistance and a voltage corresponding to the reference resistance. In addition, the control unit 130 may be configured to set the determined target voltage as a charging upper limit voltage for the battery.

The battery to which the charging upper limit voltage is set by the control unit 130 may be charged up to the set charging upper limit voltage. That is, the control unit 130 may set a charging upper limit voltage for the battery in order to prevent the degradation of the battery from being accelerated.

For example, in the embodiment of FIG. 5, the voltage corresponding to the criterion resistance ($\mathbf{R1}_{STD}$) is 3.96 V, and the voltage corresponding to the reference resistance ($\mathbf{R1}_{REF}$) is 4.2 V. Accordingly, the control unit 130 may determine a voltage region of 3.96 V or more and 4.2 V or less as the target voltage region VR.

In addition, the control unit 130 may determine one target voltage in the target voltage region VR.

According to an embodiment of determining the target voltage, the control unit 130 may be configured to calculate a resistance change rate of the resistance for each voltage in the target voltage region VR.

Here, the resistance change rate may mean an instantaneous change rate of resistance to voltage. That is, in the embodiment of FIG. 5, the control unit 130 may calculate the resistance change rate for each voltage by calculating an instantaneous change rate of the resistance for each voltage of the first resistance profile P1.

In addition, the control unit 130 may be configured to set the lowest voltage among voltages at which the calculated resistance change rate is equal to or greater than the preset criterion value as the charging upper limit voltage. In other words, the control unit 130 may set the lowest voltage among voltages at which the slope of resistance for each voltage is equal to or greater than a criterion value as the charging upper limit voltage.

For example, in the embodiment of FIG. 5, in a voltage region of 4.05 V or more and 4.15 V or less in the target voltage region VR, the resistance change rate for each voltage may be greater than or equal to the criterion value. On the other hand, in a voltage region of more than 4.15 V and less than 4.2 V, the resistance change rate for each voltage may be less than the criterion value. Accordingly, the control unit 130 may determine 4.05 V, which is the lowest voltage while the resistance change rate is greater than or equal to the criterion value, as the target voltage, and set the determined target voltage as the charging upper limit voltage ($\mathbf{V1}_{ONSET\_D}$) for the first battery.

In addition, according to another embodiment of determining the target voltage, the control unit 130 may be configured to determine a resistance flat region FR based on the criterion resistance in the target voltage region VR.

Here, the resistance flat region FR refers to a voltage region in which the resistance is maintained flat within a predetermined range even when the voltage is increased, and the resistance flat region FR may be included in the target voltage region VR.

Specifically, the control unit 130 may be configured to determine a voltage region corresponding to the resistance region equal to or less than a preset threshold value ($TH_R$) from the criterion resistance in the target voltage region VR, and determine the determined voltage region as a resistance flat region FR.

For example, in the embodiment of FIG. 6, the threshold value ($TH_R$) may be preset to 0.01Ω. In the target voltage region VR, the voltage region corresponding to the resistance region equal to or less than 0.01Ω, which is the threshold value ($TH_R$) from the criterion resistance ($\mathbf{R1}_{STD}$) of 1Ω, may be a region of 3.96 V or more and 4.05 V or less. That is, the resistance value corresponding to the voltage region of 3.96 V or more and 4.05 V or less may be included in the resistance region of 1Ω or more and 1.01Ω or less. Accordingly, the control unit 130 may determine the voltage region of 3.96 V or more and 4.05 V or less as the resistance flat region FR.

The control unit 130 may be configured to set the determined end voltage of the resistance flat region FR as a charging upper limit voltage.

Here, the start voltage of the resistance flat region FR may be the lowest voltage in the resistance flat region FR, and the end voltage of the resistance flat region FR may be the highest voltage in the resistance flat region FR. That is, the start voltage of the resistance flat region FR may be a voltage corresponding to the criterion resistance, and the end voltage of the resistance flat region FR may be the highest voltage among voltages belonging to the resistance flat region FR.

For example, in the embodiment of FIG. 6, the resistance flat region FR may be a voltage region of 3.96 V or more and 4.05 V or less. That is, 3.96 V may be a start voltage of the resistance flat region FR, and 4.05 V may be an end voltage of the resistance flat region FR. Therefore, the control unit 130 may determine 4.05 V as the target voltage, and set the determined target voltage as a charging upper limit voltage ($\mathbf{V1}_{ONSET\_FR}$) for the first battery.

The battery classification apparatus 100 according to an embodiment of the present disclosure may not only classify the type of the battery, but also may prevent the degradation of the battery from being accelerated due to overcharging by setting the charging upper limit voltage for the classified battery. Accordingly, the lifespan of the battery may be increased.

Meanwhile, in the embodiment of FIGS. 5 and 6, the charging upper limit voltage ($\mathbf{V1}_{ONSET\_D}$) based on the resistance change rate and the charging upper limit voltage ($\mathbf{V1}_{ONSET\_FR}$) based on the resistance flat region FR are the same, but in another embodiment, both charging upper limit voltages ($\mathbf{V1}_{ONSET\_D}$, $\mathbf{V1}_{ONSET\_FR}$) may be different. In this case, the control unit 130 may set the charging upper limit voltage for the battery based on a lower voltage between the charging upper limit voltage ($\mathbf{V1}_{ONSET\_D}$) based on the resistance change rate and the charging upper limit voltage ($\mathbf{V1}_{ONSET\_FR}$) based on the resistance flat region FR. That is, the control unit 130 may prevent the degradation of the battery from being accelerated during the charging process by more strictly restricting the charging upper limit voltage for the battery.

The battery classification apparatus 100 according to the present disclosure may be applied to a BMS (Battery Management System). That is, the BMS according to the present disclosure may include the battery classification apparatus 100 described above. In this configuration, at least some of the components of the battery classification apparatus 100 may be implemented by supplementing or adding functions of the configuration included in the conventional BMS. For example, the measuring unit 110, the profile generating unit 120, the control unit 130 and the storage unit 140 of the battery classification apparatus 100 may be implemented as components of the BMS.

In addition, the battery classification apparatus 100 according to the present disclosure may be provided in a battery pack. That is, the battery pack according to the present disclosure may include the above-described battery classification apparatus 100 and one or more battery cells. In addition, the battery pack may further include electrical equipment (relays, fuses, etc.) and a case.

Figure 7:
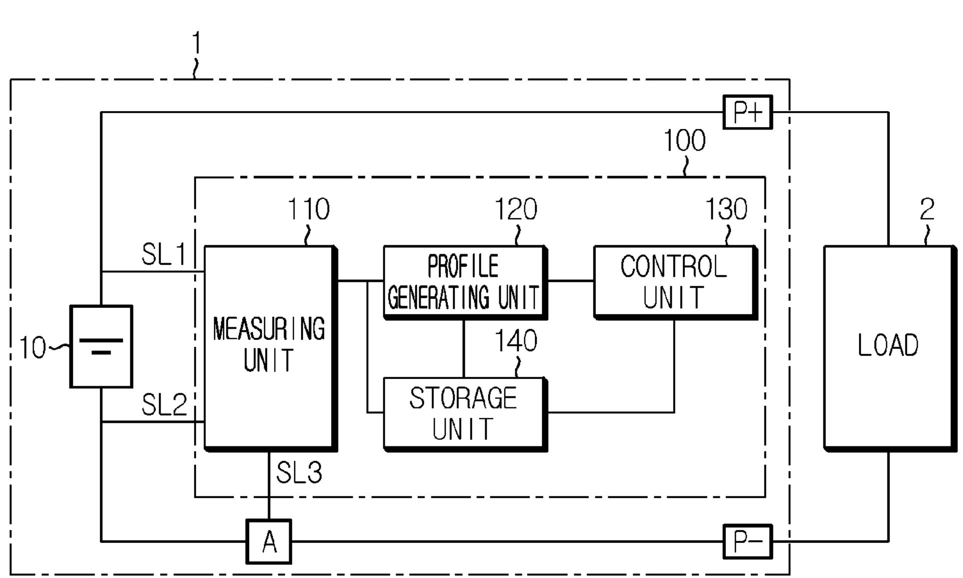
FIG. 7 is a diagram schematically showing an exemplary configuration of a battery pack according to another embodiment of the present disclosure.

FIG. 7 is a diagram schematically showing an exemplary configuration of a battery pack 1 according to another embodiment of the present disclosure.

Referring to FIG. 7, the measuring unit 110 may be connected to a current measuring unit through a third sensing line SL3. In addition, the measuring unit 110 may calculate the capacity of the battery 10 by accumulating the charging current in the process of charging the battery 10 by a load connected to a battery pack 1. In addition, the measuring unit 110 may be configured to measure the voltage and resistance whenever the capacity of the battery 10 increases by a predetermined ratio.

For example, the load may be a charging device capable of charging the battery 10. In addition, the measuring unit 110 may measure the voltage and resistance of the battery 10 whenever the capacity of the battery 10 increases by 2% in the process of charging the battery 10 by the load.

The measuring unit 110 may be connected to the battery 10 through a first sensing line SL1 and a second sensing line SL2. Specifically, the measuring unit 110 may be connected to a positive electrode terminal of the battery 10 through the first sensing line SL1, and may be connected to a negative electrode terminal of the battery 10 through the second sensing line SL2. In addition, the measuring unit 110 may measure the voltage of the battery 10 by calculating a difference between the positive electrode voltage of the battery 10 measured through the first sensing line SL1 and the negative electrode voltage of the battery 10 measured through the second sensing line SL2. Specifically, the measuring unit 110 may measure the OCV of the battery 10.

Thereafter, the measuring unit 110 may output a pulse current to the battery 10 and measure the resistance of the battery 10 based on a voltage change of the battery 10 for a predetermined time. For example, the measuring unit 110 may output a 0.5 C pulse signal to the battery 10, and measure 0.1 second resistance of the battery 10 based on the voltage change of the battery 10 for 0.1 second.

The load may be connected to the battery pack 1 to charge and/or discharge the battery 10. For example, in the embodiment of FIG. 7, one end of the load may be connected to a positive electrode terminal (P+) of the battery pack 1, and the other end of the load may be connected to a negative electrode terminal (P−) of the battery pack 1. Charging by the load may be stopped whenever the capacity of the battery 10 increases by a predetermined ratio, and may be restarted after the voltage and resistance of the battery 10 are measured by the measuring unit 110.

Figure 8:
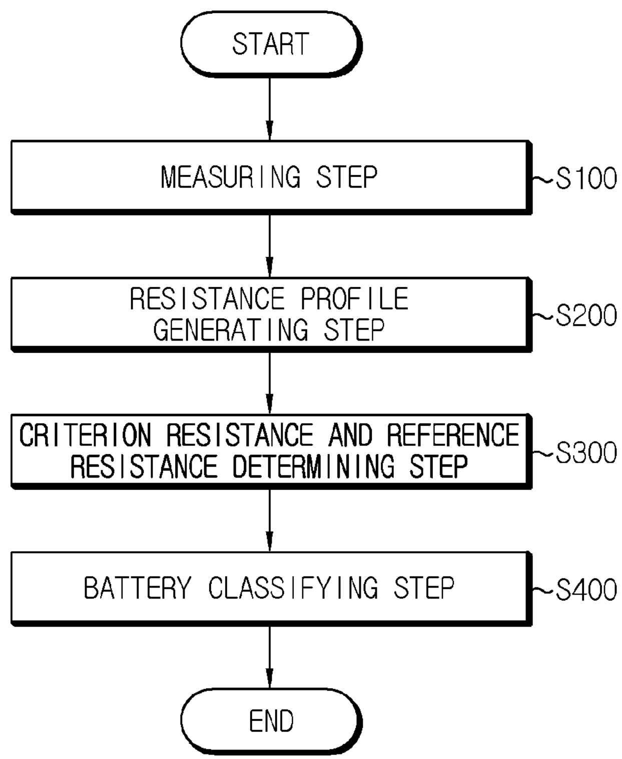
FIG. 8 is a diagram schematically showing a battery classification method according to still another embodiment of the present disclosure.

FIG. 8 is a diagram schematically showing a battery classification method according to still another embodiment of the present disclosure.

Preferably, each step of the battery classification method may be performed by the battery classification apparatus 100. Hereinafter, for convenience of explanation, contents overlapping with the previously described contents will be omitted or briefly described.

Referring to FIG. 8, the battery classification method may include a measuring step (S100), a resistance profile generating step (S200), a criterion resistance and reference resistance determining step (S300), and a battery classifying step (S400).

The measuring step (S100) is a step of measuring a voltage of a battery and measuring a resistance corresponding to the voltage of the battery, and may be performed by the measuring unit 110.

For example, the measuring unit 110 may measure the voltage and resistance of the battery whenever the capacity of the battery increases by a preset ratio.

The resistance profile generating step (S200) is a step of generating a resistance profile representing a corresponding relationship between the voltage and the resistance based on the voltage and the resistance of the battery, and may be performed by the profile generating unit 120.

The profile generating unit 120 may obtain battery information including the voltage and resistance of the battery measured by the measuring unit 110, and generate a resistance profile representing a corresponding relationship between the voltage and the resistance of the battery based on the obtained battery information.

The criterion resistance and reference resistance determining step (S300) is a step of determining a criterion resistance based on the resistance value in the resistance profile and determining a reference resistance corresponding to a highest voltage in the resistance profile, and may be performed by the control unit 130.

Here, the criterion resistance and the reference resistance to be determined by the control unit 130 may be determined according to a preset order.

For example, the control unit 130 may determine a lowest resistance value in the resistance profile as the criterion resistance. In addition, the control unit 130 may determine a resistance value corresponding to a charging end voltage of the battery in the resistance profile as the reference resistance.

For example, in the embodiment of FIG. 3, the control unit 130 may determine the lowest resistance value of 1Ω in the first resistance profile P1 as a criterion resistance ($R1_{STD}$), and determine 1.1Ω, which is a resistance value corresponding to 4.2 V that is the charging end voltage ($V1_{EOC}$), as the reference resistance ($R1_{REF}$).

The battery classifying step (S400) is a step of classifying a type of the battery according to the content of nickel contained in the battery based on the criterion resistance and the reference resistance, and may be performed by the control unit 130.

Specifically, the control unit 130 may set the threshold resistance based on the criterion resistance first. In addition, the control unit 130 may classify the battery as a high nickel-based battery or a low nickel-based battery by comparing the magnitudes of the threshold resistance and the reference resistance.

For example, the control unit 130 may be configured to classify the battery as a high nickel-based battery, when the reference resistance is equal to or greater than the threshold resistance. Conversely, the control unit 130 may be configured to classify the battery as a low nickel-based battery, when the reference resistance is less than the threshold resistance.

In the embodiment of FIG. 3, the threshold resistance ($R1_{TH}$) of the first resistance profile P1 may be 1.05Ω and the reference resistance ($R1_{REF}$) may be 1.1Ω. Since the reference resistance ($R1_{REF}$) is greater than or equal to the threshold resistance ($R1_{TH}$), the control unit 130 may classify the first battery as a high nickel-based battery. That is, the control unit 130 may classify the first battery as a battery in which the nickel content contained in the positive electrode material is 80% or more.

In the embodiment of FIG. 4, the threshold resistance ($R2_{TH}$) of the second resistance profile P2 may be 1.05Ω and the reference resistance ($R2_{REF}$) may be 1.015Ω. Since the reference resistance ($R2_{REF}$) is less than the threshold resistance ($R2_{TH}$), the control unit 130 may classify the second battery as a low nickel-based battery. That is, the control unit 130 may classify the second battery as a battery in which the nickel content contained in the positive electrode material is less than 80%.

Figure 9:
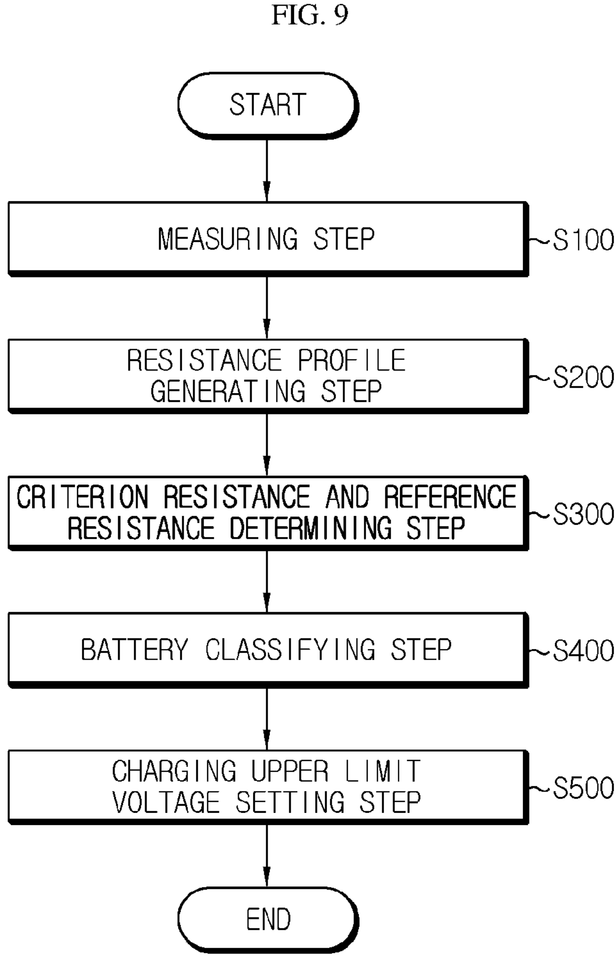
FIG. 9 is a diagram schematically showing a battery classification method according to still another embodiment of the present disclosure.

FIG. 9 is a diagram schematically showing a battery classification method according to still another embodiment of the present disclosure.

Referring to FIG. 9, the battery classification method may further include a charging upper limit voltage setting step (S500).

The charging upper limit voltage setting step (S500) is a step after the battery classifying step (S400), and may be performed by the control unit 130.

The charging upper limit voltage setting step (S500) is a step of determining a target voltage in a target voltage region VR between a voltage corresponding to the criterion resistance and a voltage corresponding to the reference resistance and setting the determined target voltage as the charging upper limit voltage for the battery.

For example, in the embodiment of FIG. 2, if the first resistance profile P1 and the second resistance profile P2 are compared, the first battery classified as a high nickel-based battery may have a greatly increased resistance at the charging end than the second battery classified as a low nickel-based battery. Since this is due to the positive electrode characteristics of a high nickel-based battery, if the battery is continuously charged up to a voltage region where resistance is greatly increased, the degradation of the battery may be accelerated.

Accordingly, the control unit 130 may determine an appropriate target voltage to prevent the degradation of the battery from being accelerated in the target voltage region VR between the criterion resistance and the reference resistance. In addition, by setting the determined target voltage as the charging upper limit voltage for the battery, the control unit 130 may prevent the degradation of the battery from being accelerated since the battery is charged to a high voltage.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
2: load
10: battery
100: battery classification apparatus
110: measuring unit
120: profile generating unit
130: control unit
140: storage unit

What is claimed is:

1. A battery classification apparatus, comprising:

a processor; and memory having programmed thereon instructions that, when executed, are configured to cause the processor to:

measure a voltage of a battery and measure a resistance corresponding to the voltage of the battery;

obtain battery information about the measured voltage and the measured resistance of the battery generate a resistance profile representing a corresponding relationship between the voltage and the resistance based on the battery information;

determine a criterion resistance based on a resistance value in the resistance profile;

determine a reference resistance corresponding to a highest voltage in the resistance profile;

classify a type of the battery into a high nickel-based battery or a low nickel-based battery based on the criterion resistance and the reference resistance, wherein the high nickel-based battery or the low nickel-based battery is determined according to a content of nickel contained in the battery;

determine a target voltage in a target voltage region between a voltage corresponding to the criterion resistance and a voltage corresponding to the reference resistance;

set the determined target voltage as a charging upper limit for the battery; and control the voltage of the battery to charge up to the charging upper limit for the battery to prevent a degradation of the battery.

2. The battery classification apparatus according to claim 1, wherein the instructions are configured to cause the processor to determine a lowest resistance value in the resistance profile as the criterion resistance.

3. The battery classification apparatus according to claim 1, wherein the instructions are configured to cause the processor to set a threshold resistance based on the criterion resistance, compare the set threshold resistance with the reference resistance, and classify the type of the battery according to the comparison result.

4. The battery classification apparatus according to claim 3, wherein the type of the battery is classified into a high nickel-based battery or a low nickel-based battery according to the content of nickel contained in the battery; and wherein the instructions are configured to cause the processor to:

classify the battery into a high nickel-based battery, when the reference resistance is equal to or greater than the threshold resistance, and classify the battery into a low nickel-based battery, when the reference resistance is less than the threshold resistance.

5. The battery classification apparatus according to claim 3, wherein the instructions are configured to cause the processor to set the threshold resistance by applying a preset criterion ratio to the criterion resistance.

6. The battery classification apparatus according to claim 1, wherein the type of the battery is classified into a high nickel-based battery or a low nickel-based battery according to the content of nickel contained in the battery, and wherein the instructions are configured to cause the processor to set the charging upper limit voltage for the battery when the battery is classified as the high nickel-based battery.

7. The battery classification apparatus according to claim 1, wherein the instructions are configured to cause the processor to calculate a resistance change rate of the resistance for each voltage in the target voltage region and set a lowest voltage among voltages at which the calculated resistance change rate is equal to or greater than a preset criterion value as the charging upper limit voltage.

8. The battery classification apparatus according to claim 1, wherein the instructions are configured to determine a resistance flat region based on the criterion resistance in the target voltage region and set an end voltage of the determined resistance flat region as the charging upper limit voltage.

9. The battery classification apparatus according to claim 8, wherein the instructions are configured to cause the processor to determine a voltage region corresponding to a resistance region equal to or less than a preset threshold value from the criterion resistance in the target voltage region and determine the determined voltage region as the resistance flat region.

10. The battery classification apparatus according to claim 1, wherein the instructions are configured to calculate a capacity of the battery in a process of charging the battery and measure the voltage and the resistance whenever the calculated capacity of the battery increases by a predetermined ratio.

11. A battery pack, comprising the battery classification apparatus according to claim 1.

12. A battery classification method, comprising:

measuring by a processor, a voltage of a battery and a resistance corresponding to the voltage of the battery;

obtaining, by the processor, a resistance profile representing a corresponding relationship between the voltage and the resistance based on the voltage and the resistance of the battery;

determining, by the processor, a criterion resistance based on a resistance value in the resistance profile and a reference resistance corresponding to a highest voltage in the resistance profile;

classifying, by the processor, a type of the battery into a high nickel-based battery or a low nickel-based battery based on the criterion resistance and the reference resistance wherein the high nickel-based battery or the low nickel-based battery is determined according to a content of nickel contained in the battery; and determining, by the processor, a target voltage in a target voltage region between a voltage corresponding to the criterion resistance and a voltage corresponding to the reference resistance;

setting, by the processor, the determined target voltage as a charging upper limit for the battery; and controlling, by the processor, the voltage of the battery so as to charge the battery up to the charging upper limit for the battery to prevent a degradation of the battery.

13. The battery classification apparatus according to claim 1, further comprising a charging structure, and wherein the instructions are configured to cause the processor to control the charging structure to charge the battery up to the charging upper limit voltage to prevent a degradation of the battery.

* * * * *